(12) United States Patent
Liu

(10) Patent No.: US 12,211,546 B2
(45) Date of Patent: Jan. 28, 2025

(54) SEMICONDUCTOR DEVICE AND MEMORY

(71) Applicant: CHANGXIN MEMORY TECHNOLOGIES, INC., Hefei (CN)

(72) Inventor: Zhonglai Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 218 days.

(21) Appl. No.: 17/954,336

(22) Filed: Sep. 28, 2022

(65) Prior Publication Data

US 2023/0410889 A1    Dec. 21, 2023

Related U.S. Application Data

(63) Continuation of application No. PCT/CN2022/107184, filed on Jul. 21, 2022.

(30) Foreign Application Priority Data

May 30, 2022 (CN) .......................... 202210603574.2

(51) Int. Cl.
G11C 11/40 (2006.01)
G11C 11/4093 (2006.01)
H03K 17/687 (2006.01)

(52) U.S. Cl.
CPC ...... *G11C 11/4093* (2013.01); *H03K 17/6871* (2013.01)

(58) Field of Classification Search
CPC ... G11C 11/4093; G11C 5/025; G11C 7/1057; G11C 7/1069; H03K 17/6871; H10B 12/50

See application file for complete search history.

(56) References Cited

U.S. PATENT DOCUMENTS 10,693,460 B1 * 6/2020 Takahashi ........... G11C 11/4093
11,463,076 B1 * 10/2022 Wu ....................... H03K 17/145
(Continued)

FOREIGN PATENT DOCUMENTS

| CN | 112187214 A | 1/2021 |
| CN | 113437962 A | 9/2021 |
| CN | 114242129 A | 3/2022 |

OTHER PUBLICATIONS

ISA State Intellectual Property Office of the People's Republic of China, International Search Report Issued in Application No. PCT/CN2022/107184, Dec. 19, 2022 WIPO, 9 pages.

(Continued)

*Primary Examiner* — Mohammed A Bashar
(74) *Attorney, Agent, or Firm* — Kilpatrick Townsend & Stockton LLP

(57) ABSTRACT

Embodiments relate to the field of semiconductor technology, and proposes a semiconductor device and a memory. The semiconductor device includes a pull-up circuit integration region, a pull-down circuit integration region and a compensation circuit integration region not overlapped with one another. The semiconductor device further includes an output circuit, and the output circuit includes: a pull-up circuit, a pull-down circuit, and a compensation circuit. The pull-up circuit is connected to a signal output line, and the pull-up circuit is positioned in the pull-up circuit integration region. The pull-down circuit is connected to the signal output line, and the pull-down circuit is positioned in the pull-down circuit integration region. The compensation circuit is configured to enhance a drive capability of an output signal from the signal output line, and the compensation circuit is positioned in the compensation circuit integration region.

19 Claims, 7 Drawing Sheets

(56) References Cited

U.S. PATENT DOCUMENTS

| | | | |
|---|---|---|---|
| 2006/0017457 A1* | 1/2006 | Pan | H03K 19/00384 |
| | | | 326/32 |
| 2008/0211536 A1 | 9/2008 | Nguyen et al. | |
| 2015/0171863 A1* | 6/2015 | Ha | H03K 19/0005 |
| | | | 326/30 |
| 2018/0204521 A1 | 7/2018 | Gu et al. | |
| 2018/0293924 A1* | 10/2018 | Wang | G09G 3/20 |
| 2021/0118476 A1 | 4/2021 | Kojima | |

OTHER PUBLICATIONS

European Patent Office, Extended European Search Report Issued in Application No. 22838628.0, Apr. 23, 2024, Germany, 8 pages.

\* cited by examiner

SEMICONDUCTOR DEVICE AND MEMORY

CROSS-REFERENCE TO RELATED APPLICATION

This application is a continuation of PCT/CN2022/107184, filed on Jul. 21, 2022, which claims priority to Chinese Patent Application No. 202210603574.2 titled "SEMICONDUCTOR DEVICE AND MEMORY" and filed on May 30, 2022, the entire contents of which are incorporated herein by reference.

TECHNICAL FIELD

The present disclosure relates to the field of semiconductor technology, and more particularly, to a semiconductor device and a memory.

BACKGROUND

In related technologies, an output circuit of a memory includes a pull-up circuit, a pull-down circuit, and a compensation circuit configured to improve a drive capability of an output signal from the output circuit. The compensation circuit is generally integrated in an integration region where the pull-up circuit and the pull-down circuit are positioned.

However, it is found that a larger parasitic capacitance may be formed between a control line connected to the compensation circuit and the pull-up circuit or pull-down circuit, which is not conducive to optimization of a signal from the control line connected to the compensation circuit.

It should be noted that information disclosed in the above background section is used merely for enhancement of understanding of the background of the present disclosure, and therefore may include information that does not constitute the prior art known to those of ordinary skill in the art.

SUMMARY

According to one aspect of the present disclosure, there is provided a semiconductor device, wherein the semiconductor device includes a pull-up circuit integration region, a pull-down circuit integration region and a compensation circuit integration region not overlapped with one another. The semiconductor device further includes an output circuit, which includes: a pull-up circuit, a pull-down circuit, and a compensation circuit. The pull-up circuit is connected to a signal output line, and the pull-up circuit is positioned in the pull-up circuit integration region. The pull-down circuit is connected to the signal output line, and the pull-down circuit is positioned in the pull-down circuit integration region. The compensation circuit is configured to enhance a drive capability of an output signal from the signal output line, and the compensation circuit is positioned in the compensation circuit integration region.

According to one aspect of the present disclosure, there is provided a memory, which includes the above-described semiconductor device.

It is to be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

The exemplary embodiments will now be described more fully with reference to the accompanying drawings. However, the exemplary embodiments can be implemented in a variety of forms and should not be construed as being limited to the embodiments set forth herein. Rather, these embodiments are provided such that the present disclosure will be thorough and complete and will fully convey the concepts of exemplary embodiments to those skilled in the art. Throughout the drawings, similar reference signs indicate the same or similar structures, and their detailed description will be omitted.

Although this specification employs relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". Other relative terms such as "high", "low", "top", "bottom", "left", "right" and so on also have similar meanings. When a certain structure is "above" other structures, it likely means that the certain structure is integrally formed on the other structures, or the certain structure is "directly" arranged on the other structures, or the certain structure is "indirectly" arranged on the other structures by means of another structure.

The terms "one", "a" and "the" are intended to mean that there exists one or more elements/constituent parts/etc. The terms "comprising" and "having" are intended to be inclusive and mean that there may be additional elements/constituent parts/etc. other than the listed elements/constituent parts/etc.

Figure 1:
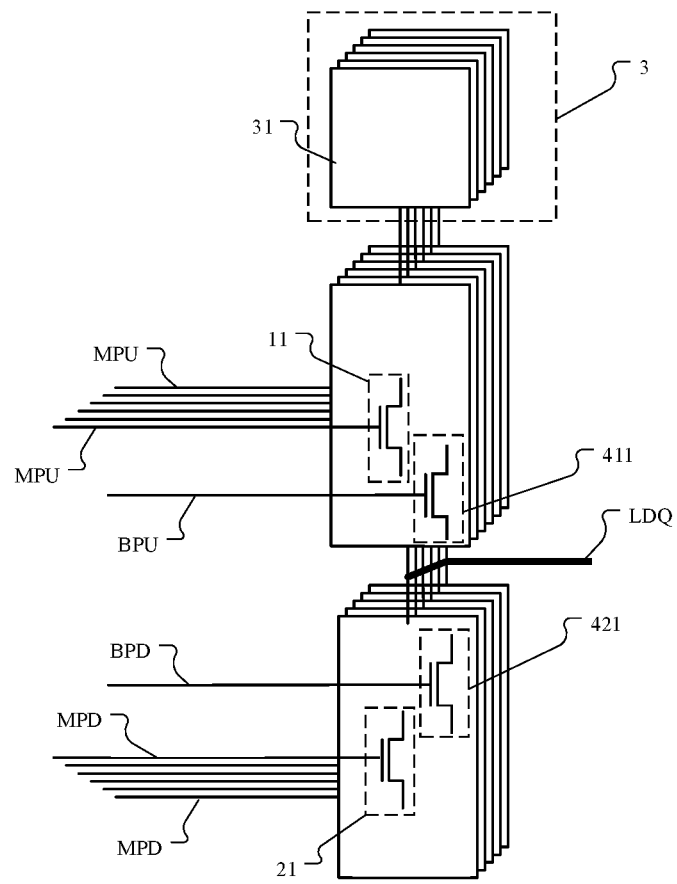
FIG. 1 is a schematic structural diagram of an output circuit in an exemplary embodiment.
Figure 2:
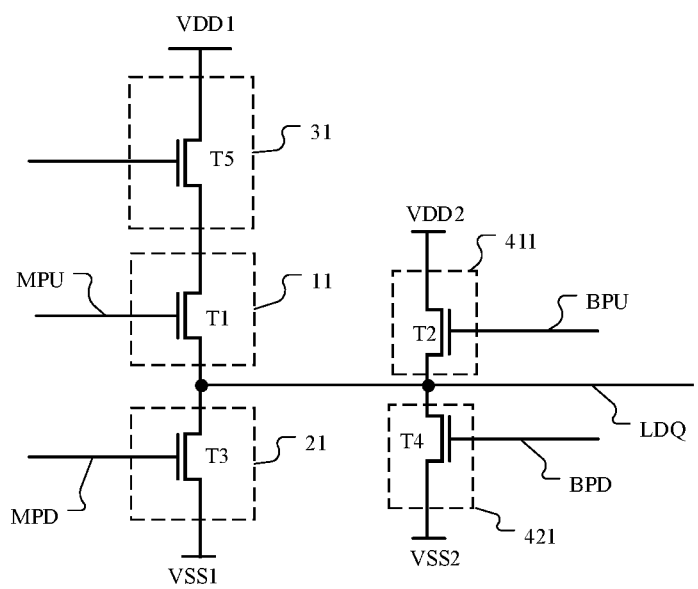
FIG. 2 is an equivalent circuit diagram of part of structures of the output circuit shown in FIG. 1.
Figure 3:
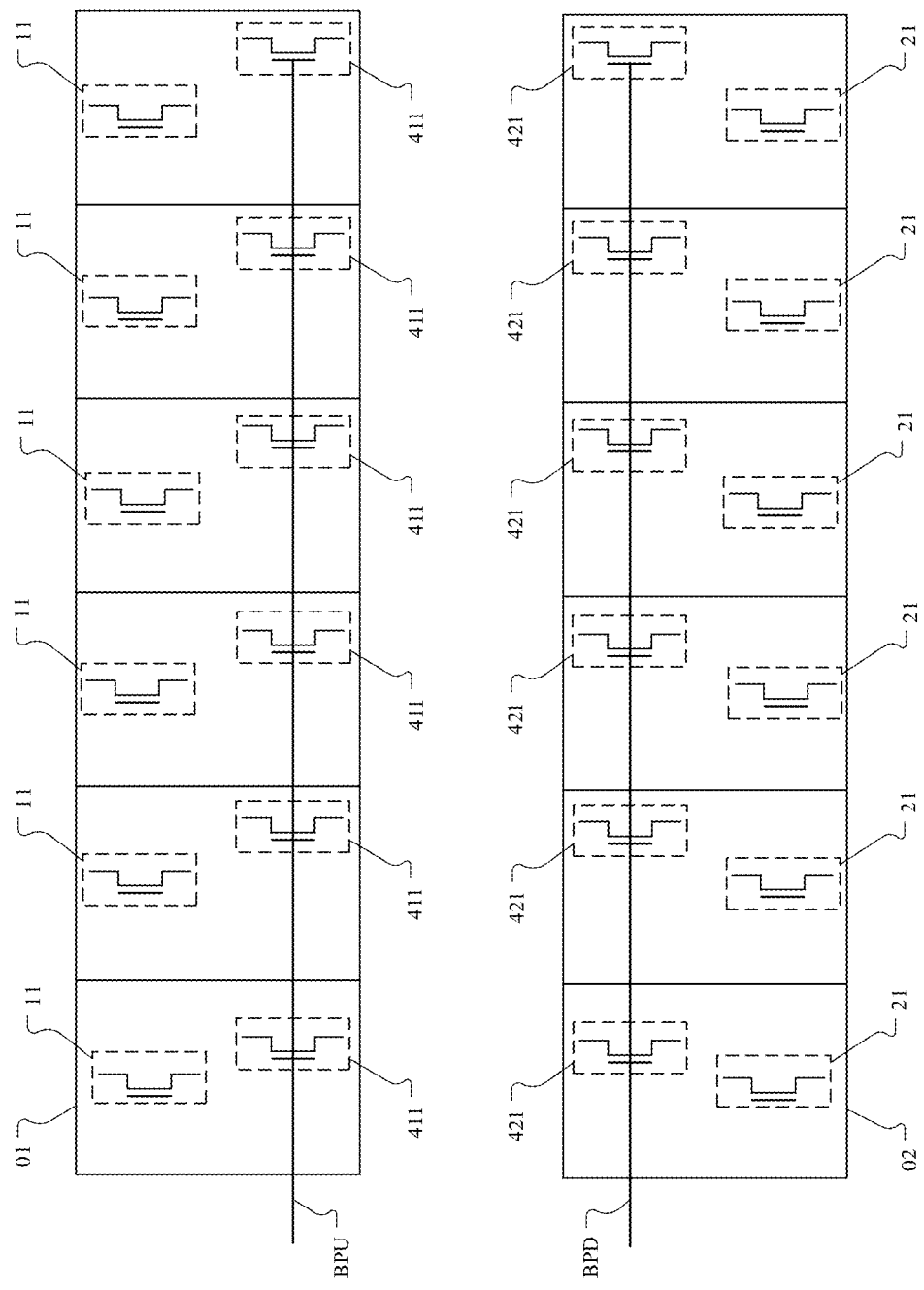
FIG. 3 is a structural layout of the output circuit shown in FIG. 1.

As shown in FIGS. 1, 2, and 3, FIG. 1 is a schematic structural diagram of an output circuit in an exemplary embodiment, FIG. 2 is an equivalent circuit diagram of part of structures of the output circuit shown in FIG. 1, and FIG. 3 is a structural layout of the output circuit shown in FIG. 1.

The output circuit includes a pull-up circuit, a pull-down circuit, a switch circuit 3, a pull-up compensation circuit, and a pull-down compensation circuit. The pull-up circuit includes a plurality of pull-up subcircuits 11, the pull-down circuit includes a plurality of pull-down subcircuits 21, the switch circuit 3 includes a plurality of switch subcircuits 31, the pull-up compensation circuit includes a plurality of pull-up compensation subcircuits 411, and the pull-down compensation circuit includes a plurality of pull-down compensation subcircuits 421. As shown in FIGS. 1, 2, and 3, the pull-up subcircuit 11 may include a first transistor T1, the pull-down subcircuit 21 may include a third transistor T3, the pull-up compensation subcircuit 411 may include a second transistor T2, the pull-down compensation circuit may include a fourth transistor T4, and the switch subcircuit 31 may include a fifth transistor T5. As shown in FIG. 2, a pull-up subcircuit 11, a pull-down subcircuit 21, a switch subcircuit 31, a pull-up compensation subcircuit 411, and a pull-down compensation subcircuit 421 may form an output unit. In the same output unit, a first electrode of the first transistor T1 is connected to a signal output line LDQ, a second electrode of the first transistor T1 is connected to a second electrode of the fifth transistor T5, and a gate of the first transistor T1 is connected to a pull-up control signal line MPU. A first electrode of the fifth transistor T5 is connected to a first high-level power supply terminal VDD1. A first electrode of the third transistor T3 is connected to a signal output line LDQ, a second electrode of the third transistor T3 is connected to a first low-level power supply terminal VSS1, and a gate of the third transistor T3 is connected to a pull-down control signal line MPD. A first electrode of the second transistor T2 is connected to the signal output line LDQ, a second electrode of the second transistor T2 is connected to a second high-level power supply terminal VDD2, and a gate of the second transistor T2 is connected to a pull-up compensation control line BPU. A first electrode of the fourth transistor T4 is connected to the signal output line LDQ, a second electrode of the fourth transistor T4 is connected to a second low-level power supply terminal VSS2, and a gate of the fourth transistor T4 is connected to a pull-down compensation control line BPD.

In this exemplary embodiment, when the switch subcircuit 31 is turned on, a valid level signal is inputted into the pull-up control signal line MPU or the pull-down control signal line MPD to turn on one of the transistors connected thereto. When the valid level signal is inputted into the pull-up control signal line MPU to turn on the pull-up subcircuit 11, the pull-down subcircuit 21 is turned off, and the signal output line LDQ outputs a high-level signal. When the valid level signal is inputted into the pull-down control signal line MPD to turn on the pull-down subcircuit 21, the pull-up subcircuit 11 is turned off, and the signal output line LDQ outputs a low-level signal, such that the output circuit may controllably output the high-level signal or the low-level signal.

In addition, the pull-up compensation control line BPU may output a valid level signal to turn on the pull-up compensation subcircuit 411 when the valid level signal is inputted into the pull-up control signal line MPU, and the pull-up compensation subcircuit 411 transmits a high-level signal of the second high-level power supply terminal VDD2 to the signal output line LDQ, such that a pull-up drive capability of an input signal from the signal output line LDQ may be enhanced. The pull-down compensation control line BPD may output a valid level signal to turn on the pull-down compensation subcircuit 421 when the pull-down control signal line MPD outputs the valid level signal, and the pull-down compensation subcircuit 421 may transmit a low-level signal of the second low-level power supply terminal VSS2 to the signal output line LDQ, such that a pull-down drive capability of an output signal from the signal output line LDQ may be enhanced. The stronger the pull-up drive capability of the output signal is, the steeper a rising edge of the output signal is; the stronger the pull-down drive capability of the output signal is, the steeper a falling edge of the output signal is; and correspondingly, the stronger the pull-up drive capability and the pull-down drive capability of the output signal are, the higher a maximum frequency the output signal can reach.

The first high-level power supply terminal VDD1 and the second high-level power supply terminal VDD2 may share the same high-level power supply terminal, and the first low-level power supply terminal VSS1 and the second low-level power supply terminal VSS2 may share the same low-level power supply terminal. The first transistor T1, the second transistor T2, the third transistor T3, the fourth transistor T4, and the fifth transistor T5 may be N-type transistors or P-type transistors. The valid level signal may be understood as an on-level signal of a target circuit. For example, when the target circuit is an N-type transistor, the valid level signal is a high-level signal; and when the target circuit is a P-type transistor, the valid level signal is a low-level signal. In one embodiment, the transistors T3 and T4 are P-Channel Metal Oxide Semiconductor (PMOS) transistors, and the transistors T1, T2 and T5 are N-Channel Metal Oxide Semiconductor (NMOS) transistors.

As shown in FIG. 3, in the same output circuit, number of the pull-up compensation subcircuits 411 may be equal to that of the pull-up subcircuits 11, and the pull-up compensation subcircuits 411 may be scattered in a pull-up subcircuit integration region 01 where the pull-up subcircuits 11 are positioned. Number of the pull-down compensation subcircuits 421 may be equal to that of the pull-down subcircuits 21, and the pull-down compensation subcircuits 421 may be scattered in a pull-down subcircuit integration region 02 where the pull-down subcircuits 21 are positioned. In the same output circuit, the number of the pull-up subcircuits 11 may be equal to that of the pull-down subcircuits 21. For example, the number of the pull-up subcircuits 11 and the number of the pull-down subcircuits 21 may be six. However, because the pull-up compensation subcircuits 411 are scattered in the pull-up subcircuit integration region 01 where the pull-up subcircuits 11 are positioned, winding of the pull-up compensation control line BPU is longer, and a larger parasitic capacitance may be generated between the longer pull-up compensation control line BPU and other structures, which is not conducive to optimization of timing sequence of a signal from the pull-up compensation control line BPU. Similarly, because the pull-down compensation subcircuits 421 are scattered in the pull-down subcircuit integration region 02 where the pull-down subcircuits 21 are position, winding of the pull-down compensation control line BPD is longer, and a larger parasitic capacitance may be generated between the longer pull-down compensation control line BPD and other structures, which is not conducive to optimization of timing sequence of a signal from the pull-down compensation control line BPD.

Figure 4:
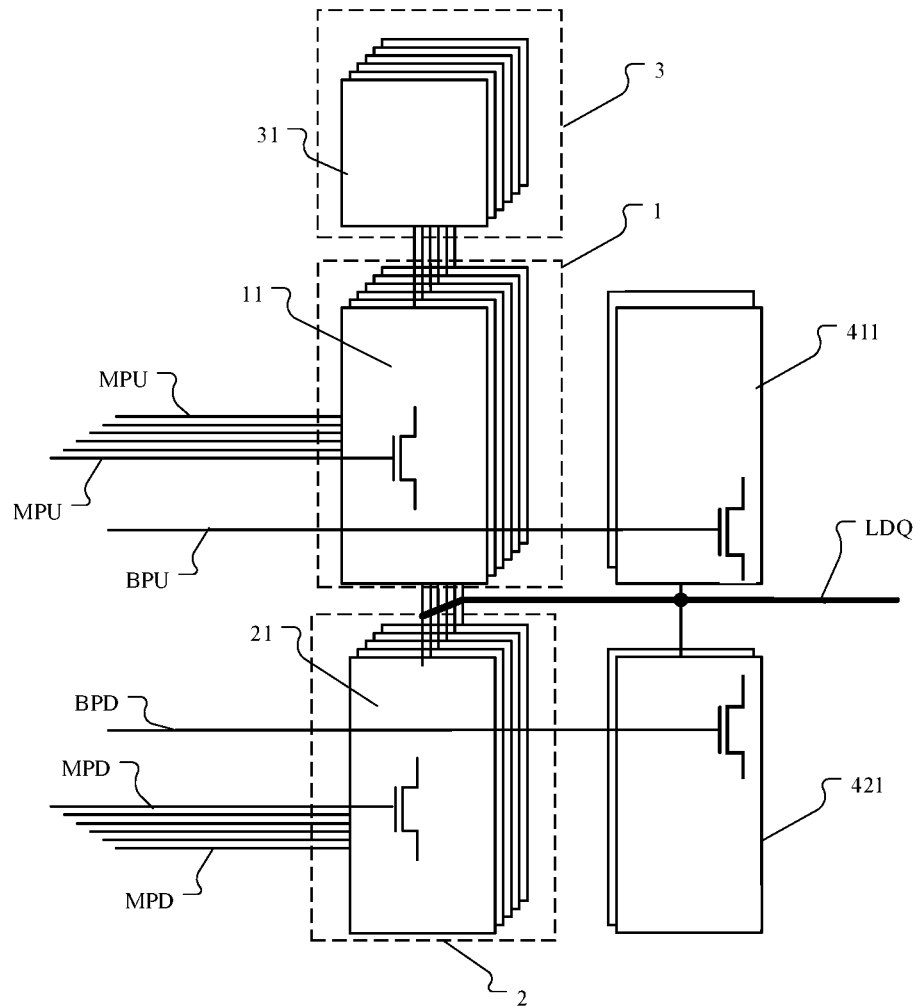
FIG. 4 is a schematic structural diagram of a semiconductor device in an exemplary embodiment of the present disclosure.
Figure 5:
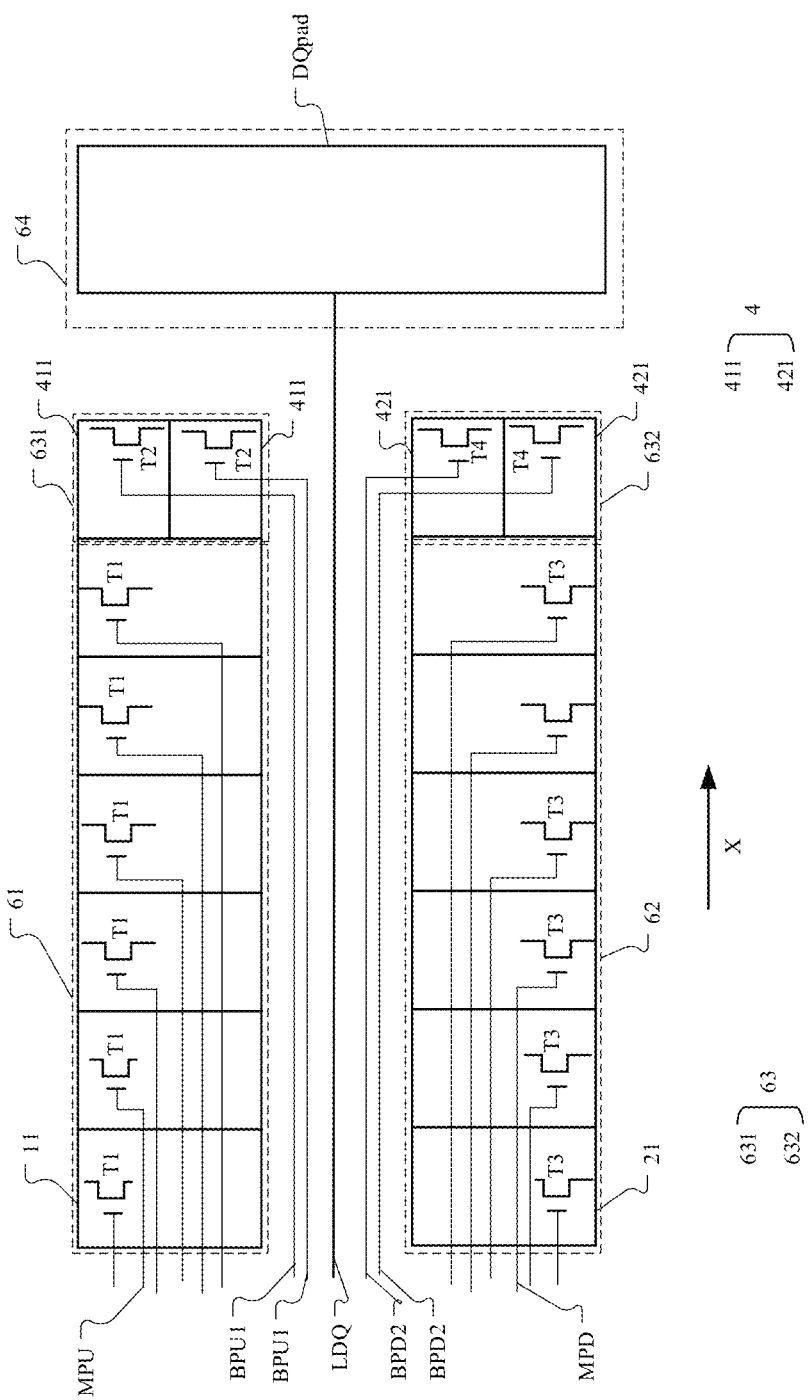
FIG. 5 is a structural layout of the semiconductor device shown in FIG. 4.

On this basis, this exemplary embodiment provides a semiconductor device, as shown in FIG. 4 and FIG. 5, FIG. 4 is a schematic structural diagram of a semiconductor device in the present disclosure, and FIG. 5 is a structural layout of the semiconductor device shown in FIG. 4. The semiconductor device includes a pull-up circuit integration region 61, a pull-down circuit integration region 62, and a compensation circuit integration region 63 that do not overlap each other, and the semiconductor device further includes an output circuit, where the output circuit may include: a pull-up circuit 1, a pull-down circuit 2, and a compensation circuit 4. The pull-up circuit 1 is connected to the signal output line LDQ, and the pull-up circuit 1 is positioned in the pull-up circuit integration region 61. The pull-down circuit 2 is connected to the signal output line LDQ, and the pull-down circuit 2 is positioned in the pull-down circuit integration region 62. The compensation circuit 4 is configured to enhance the drive capability of the output signal from the signal output line LDQ, and the compensation circuit 4 is positioned in the compensation circuit integration region 63.

In this exemplary embodiment, in the semiconductor device, the compensation circuit 4 is arranged in the compensation circuit integration region 63 in a centralized manner, such that capacity of a parasitic capacitance formed between a compensation control line connected to the compensation circuit 4 and other structures may be reduced, which may be advantageous to reducing optimization of timing sequence of a signal from the compensation control line connected to the compensation circuit 4.

In this exemplary embodiment, as shown in FIG. 5, the signal output line LDQ extends along a first direction X and is configured to transmit a signal along the first direction X. The compensation circuit integration region 63 may be positioned on a side of the pull-up circuit integration region 61 in the first direction X, and the compensation circuit integration region 63 may be positioned on a side of the pull-down circuit integration region 62 in the first direction X. As shown in FIG. 5, the semiconductor device may further include an output pad integration region 64, and the output pad integration region 64 may be positioned on a side of the compensation circuit integration region 63 away from the pull-up circuit integration region 61. The output pad integration region 64 may be provided with an output pad DQpad, the output pad DQpad may be connected to the signal output line LDQ, and the output pad Dqpad is configured to output an output signal to outside of the semiconductor device.

In this exemplary embodiment, as shown in FIG. 5, the compensation circuit 4 may include at least one first pull-up compensation subcircuit 411, and the first pull-up compensation subcircuit 411 is configured to pull up the output signal. The compensation circuit integration region 63 may include a first integration region 631, the first pull-up compensation subcircuit 411 may be positioned in the first integration region 631, and the first integration region 631 may be positioned on a side of the pull-up circuit integration region 61 in the first direction X.

In this exemplary embodiment, as shown in FIG. 5, the compensation circuit 4 may further include at least one first pull-down compensation subcircuit 421, and the first pull-down compensation subcircuit 421 is configured to pull down the output signal. The compensation circuit integration region 63 may further include a second integration region 632, the first pull-down compensation subcircuit 421 may be positioned in the second integration region 632, and the second integration region 632 is positioned on a side of the pull-down circuit integration region 62 in the first direction X.

Figure 6:
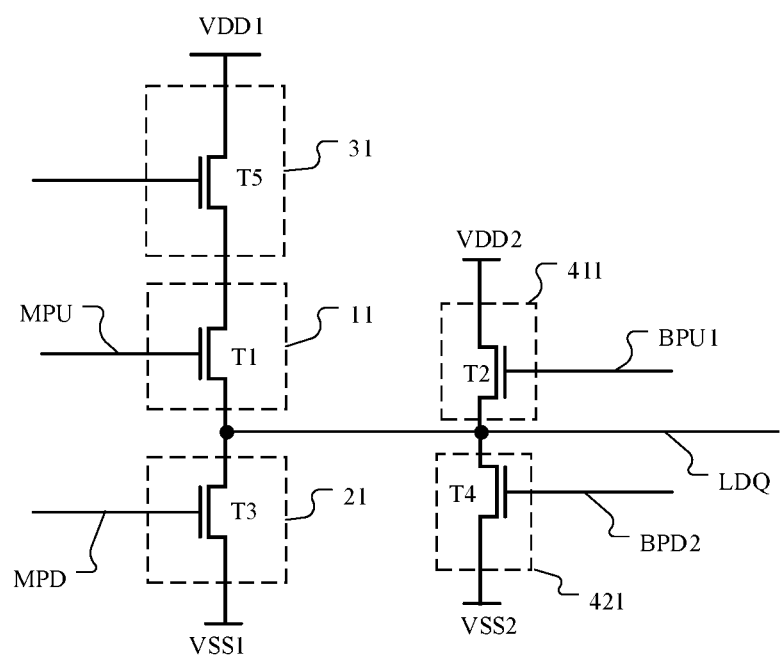
FIG. 6 is an equivalent circuit diagram of part of structures of an output circuit in the semiconductor device shown in FIG. 4.

In this exemplary embodiment, as shown in FIG. 6, an equivalent circuit diagram of part of structures of the output circuit in the semiconductor device shown in FIG. 4 is illustrated. The first pull-up compensation subcircuit 411 is connected to the signal output line LDQ and a first control signal line BPU1, and the first pull-up compensation subcircuit 411 is configured to pull up the output signal in response to an enable signal from the first control signal line BPU1. The pull-up circuit 1 may include a plurality of pull-up subcircuits 11, and each of the plurality of pull-up subcircuits 11 includes a first transistor T1, where a first electrode of the first transistor T1 is connected to the signal output line LDQ, a second electrode of the first transistor T1 is connected to the first high-level power supply terminal VDD1, and a gate of the first transistor T1 is connected to the pull-up control signal line MPU.

In this exemplary embodiment, as shown in FIG. 6, the first pull-up compensation subcircuit 411 may include a second transistor T2, where a first electrode of the second transistor T2 is connected to the signal output line LDQ, a second electrode the second transistor T2 may be connected to the second high-level power supply terminal VDD2, and a gate the second transistor T2 may be connected to the first control signal line BPU1. The first control signal line BPU1 may output a valid level signal to turn on the first pull-up compensation subcircuit 411 when the pull-up control signal line MPU outputs the valid level signal, and the turned-on first pull-up compensation subcircuit 411 transmits a high-level signal from the second high-level power supply terminal VDD2 to the signal output line LDQ, to perform pull-up compensation for a signal from the signal output line LDQ. The first control signal line BPU1 may output the valid level signal at a starting moment when the pull-up control signal line MPU outputs the valid level signal. For example, when the first transistor T1 is a P-type transistor, the first control signal line BPU1 may output the valid level signal on a falling edge of a signal from the control signal line MPU, to implement the pull-up compensation for the signal from the signal output line LDQ.

The first control signal line BPU1 is connected to the first pull-up compensation subcircuit 411 by means of a contact hole, and a smaller distance is provided between this contact hole and other conductive structure or other contact hole in an extension direction of a film layer, such that a larger parasitic capacitance is easily formed between a hole structure connected to the first control signal line BPU1 and other structures. In this exemplary embodiment, in the same output circuit, the number of the pull-up subcircuits 11 in the pull-up circuit 1 may be greater than that of the first pull-up compensation subcircuits 411 in the compensation circuit 4. For example, in this exemplary embodiment, the number of the pull-up subcircuits 11 in the pull-up circuit 1 may be six, and the number of the first pull-up compensation subcircuits 411 in the compensation circuit 4 may be two. In this exemplary embodiment, by reducing the number of the first pull-up compensation subcircuit 411, number of holes between the first control signal line BPU1 and the first pull-up compensation subcircuit 411 may be reduced, such that the parasitic capacitance of the first control signal line BPU1 may be effectively reduced.

An arrangement direction of the first pull-up compensation subcircuits 411 may be perpendicular or parallel to that of the pull-up subcircuits 11 in the pull-up circuit. That is, the arrangement direction of the second transistors T2 may be perpendicular or parallel to that of the first transistors T1. It should be noted that limitation of the arrangement direction does not limit a gate length direction. For example, when the arrangement direction of the second transistor T2 is perpendicular to that of the first transistor T1, the gate length direction of the second transistor T2 may be parallel or perpendicular to that of the first transistor T1.

In this exemplary embodiment, the number of the first pull-up compensation subcircuits 411 is reduced. To ensure the pull-up capability of the first pull-up compensation subcircuits 411 to the output signal, a size of the second transistor T2 may be correspondingly increased in this exemplary embodiment, such that a single first pull-up compensation subcircuits 411 has a stronger drive capability. Because the compensation circuit integration region 63 is positioned on a side of a whole formed by the pull-up circuit integration region 61 and the pull-down circuit integration region 62, increasing the size of the second transistor T2 having a slightly negative effect on the first transistor T1 in the pull-up circuit 1, that is, a layout area of a certain first transistor T1 is not occupied too much. Therefore, the solution of increasing the size of the second transistor T2 and reducing the number of the first pull-up compensation subcircuits 411 may be achieved. In this exemplary embodiment, the size of the second transistor T2 may be greater than that of the first transistor T1.

In this exemplary embodiment, as shown in FIG. 4, FIG. 5 and FIG. 6, the first pull-down compensation subcircuit 421 may be connected to the signal output line LDQ and the second control signal line BPD2, and the first pull-down compensation subcircuit 421 may be configured to pull down the output signal in response to an enable signal from the second control signal line BPD2. The pull-down circuit 2 may include a plurality of pull-down subcircuits 21, and each of the pull-down subcircuits 21 may include a third transistor T3, where a first electrode of the third transistor T3 is connected to the signal output line LDQ, a second electrode of the third transistor T3 is connected to the first low-level power supply terminal VSS1, and a gate of the third transistor T3 is connected to the pull-down control signal line MPD.

In this exemplary embodiment, as shown in FIG. 4, FIG. 5 and FIG. 6, the first pull-down compensation subcircuit 421 may include a fourth transistor T4, where a first electrode of the fourth transistor T4 is connected to the signal output line LDQ, and a second electrode of the fourth transistor T4 is connected to the second low-level power supply terminal VSS2. The second control signal line BPD2 may output a valid level signal at a starting moment when the pull-down control signal line MPD outputs the valid level signal, to turn on the first pull-down compensation subcircuit 421, and the turned-on first pull-down compensation subcircuit 421 may transmit a low-level signal from the second low-level power supply terminal VSS2 to the signal output line LDQ, to pull down the signal from the signal output line LDQ.

In this exemplary embodiment, the second control signal line BPD2 is connected to a first pull-down compensation subcircuit 421 by means of a contact hole, and a smaller distance is provided between this contact hole connected to the second control signal line BPD2 and other conductive structure or other contact hole in an extension direction of a film layer, such that a larger parasitic capacitance is easily formed between a hole structure connected to the second control signal line BPD2 and other structure. In this exemplary embodiment, in the same output circuit, the number of the pull-up subcircuits 21 in the pull-up circuit 2 may be greater than that of the first pull-up compensation subcircuits 421 in the compensation circuit 4. For example, in this exemplary embodiment, the number of the pull-down subcircuits 21 in the pull-down circuit 2 may be six, and the number of the first pull-down compensation subcircuits 421 in the compensation circuit 4 may be two. In this exemplary embodiment, by reducing the number of the first pull-down compensation subcircuits 421, the number of holes between the second control signal line BPD2 and the first pull-down compensation subcircuits 421 may be reduced, such that the parasitic capacitance of the second control signal line BPD2 may be effectively reduced.

In this exemplary embodiment, the number of the first pull-down compensation subcircuits 421 is reduced. To ensure the pull-down capability of the first pull-down compensation subcircuits 421 to the output signal, a size of the fourth transistor T4 may be correspondingly increased in this exemplary embodiment, such that a single first pull-down compensation subcircuits 421 has a stronger drive capability. For example, in this exemplary embodiment, the size of the fourth transistor T4 may be larger than that of the third transistor T3, and reference may be made to the second transistor T2 for feasibility principles of increasing the size of the fourth transistor T4.

As shown in FIGS. 4 and 6, the output circuit may further include a switch circuit 3, the switch circuit 3 may include a plurality of switch subcircuits 31, and each of the switch subcircuits 31 may include a fifth transistor T5, where a first electrode of the fifth transistor T5 may be connected to the first high-level power supply terminal VDD1, and a second electrode of the fifth transistor T5 is connected to the second electrode of the first transistor T1.

It should be noted that in this exemplary embodiment, the first high-level power supply terminal VDD1 and the second high-level power supply terminal VDD2 may share the same high-level power supply terminal, and the first low-level power supply terminal VSS1 and the second low-level power supply terminal VSS2 may share the same low-level power supply terminal.

In this exemplary embodiment, as shown in FIG. 5, the plurality of pull-up subcircuits 11 may be distributed along the first direction X, the plurality of pull-down subcircuits 21 may be distributed along the first direction X, and a region where the signal output line LDQ is positioned may be positioned between the pull-up circuit integration region 61 and the pull-down circuit integration region 62. The first control signal line BPU1, the pull-up control signal line MPU, the second control signal line BPD2, and the pull-down control signal line MPD may extend along the first direction X, where a region where the first control signal line BPU1 is positioned may be positioned between a region where the pull-up control signal line MPU is positioned and the region where the signal output line LDQ is positioned, and a region where the second control signal line BPD2 is positioned may be positioned between a region where the pull-down control signal line MPD is positioned and the region where the signal output line LDQ is positioned. The first control signal line BPU1 may be configured to shield noise interference between the pull-up control signal line MPU and the signal output line LDQ. The second control signal line BPD2 may be configured to shield noise interference between the pull-down control signal line MPD and the signal output line LDQ.

Figure 7:
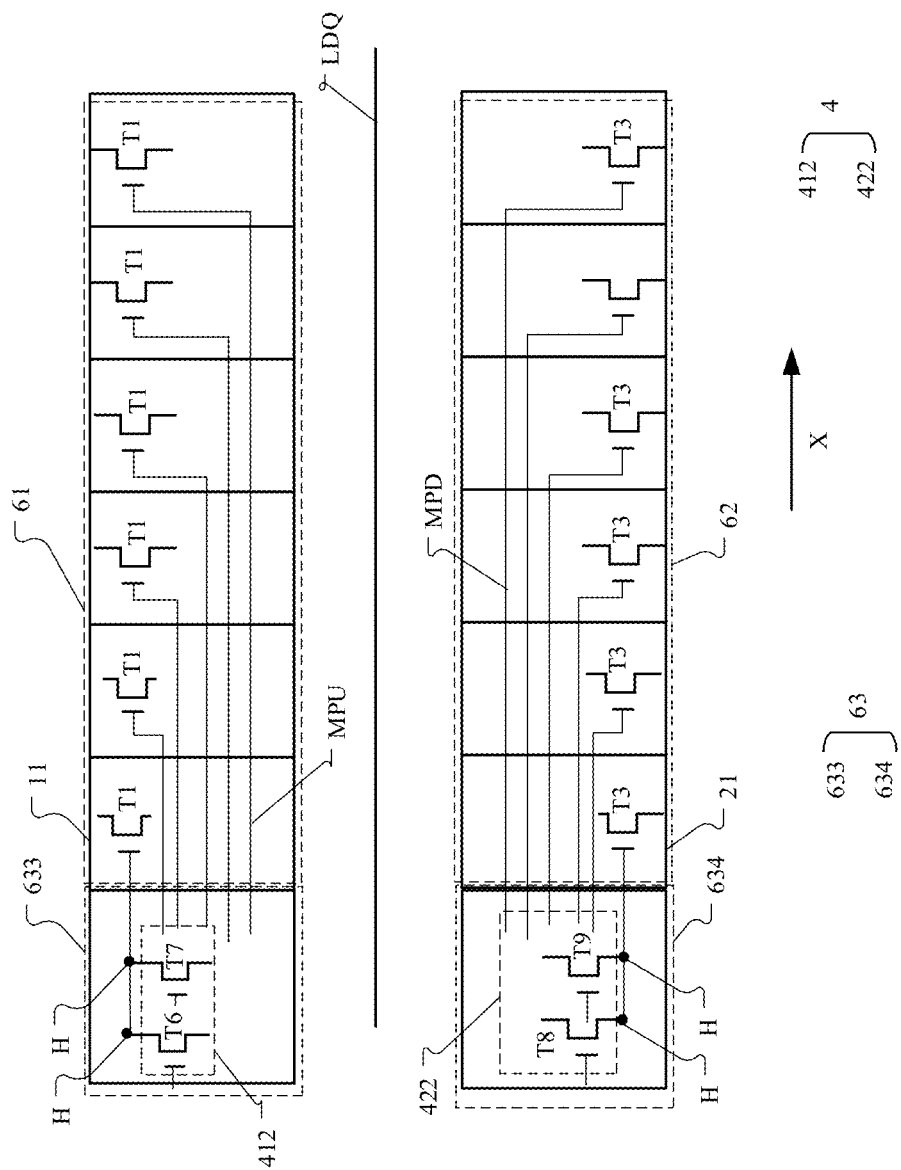
FIG. 7 is a structural layout of a semiconductor device in another exemplary embodiment of the present disclosure.

It should be understood that in other exemplary embodiments, an integration region of the first pull-up compensation subcircuit 411 in FIG. 5 may also be positioned on a side of the pull-up circuit integration region 61 in a second direction, where the second direction is opposite to the first direction X. This setting can increase a distance between the first control signal line BPU1 and the output pad Dqpad, such that the parasitic capacitance between the first control signal line BPU1 and the output pad Dqpad may be reduced. Similarly, an integration region of the first pull-down compensation subcircuit 421 may also be positioned on a side of the pull-down circuit integration region 62 in the second direction. As shown in FIG. 7, a structural layout of the semiconductor device in another exemplary embodiment of the present disclosure is illustrated. In this exemplary embodiment, the signal output line LDQ extends along the first direction X and is configured to transmit a signal along the first direction X. The compensation circuit integration region 63 may positioned on a side of the pull-up circuit integration region 61 in the second direction, and the compensation circuit integration region 63 may be positioned on a side of the pull-down circuit integration region 62 in the second direction, where the second direction is opposite to the first direction X.

In this exemplary embodiment, the compensation circuit 4 may include at least one second pull-up compensation subcircuit 412; the compensation circuit integration region 63 may further include a third integration region 633, and the second pull-up compensation subcircuit 412 may be positioned in the third integration region 633; and the third integration region 633 may be positioned on a side of the pull-up circuit integration region 61 in the second direction.

In this exemplary embodiment, the compensation circuit 4 may further include at least one second pull-down compensation subcircuit 422; the compensation circuit integration region 63 may further include a fourth integration region 634, and the second pull-down compensation subcircuit 422 may be positioned in the fourth integration region 634; and the fourth integration region 634 may be positioned on a side of the pull-down circuit integration region 62 in the second direction.

It should be noted that although in the structural layout shown in FIG. 7, the arrangement direction of the second pull-up compensation subcircuit 412 and the second pull-down compensation subcircuit 422 is parallel to the arrangement direction of the pull-up subcircuit 11 and the pull-down subcircuit 21, this merely serve as an example. In fact, the arrangement direction of the second pull-up compensation subcircuit 412 and the second pull-down compensation subcircuit 422 may also be perpendicular to the arrangement direction of the pull-up subcircuit 11 and the pull-down subcircuit 21.

Figure 8:
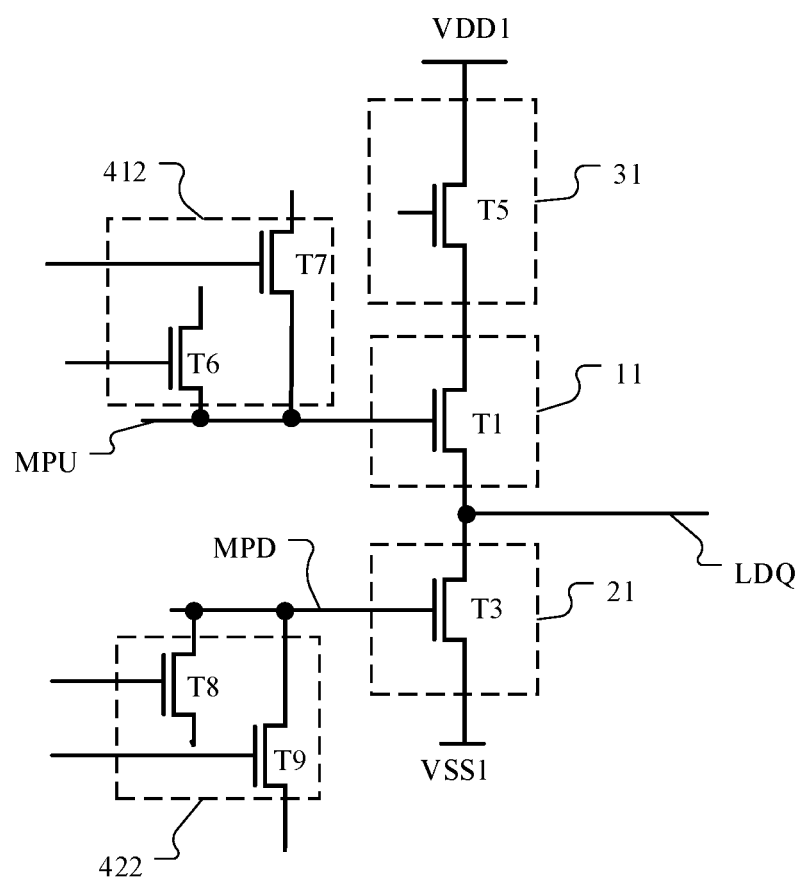
FIG. 8 is an equivalent circuit diagram of part of structures of an output circuit in the semiconductor device shown in FIG. 7.

In this exemplary embodiment, as shown in FIG. 8, an equivalent circuit diagram of part of structures of the output circuit in the semiconductor device shown in FIG. 7 is illustrated. The second pull-up compensation subcircuit 412 may be connected to the pull-up control signal lines MPU, and the second pull-up compensation subcircuit 412 may be configured to synchronously compensate for a signal from the pull-up control signal lines MPU. The second pull-up compensation subcircuits 412 may be arranged in one-to-one correspondence with the pull-up control signal lines MPU, and the second pull-up compensation subcircuit 412 may be configured to synchronously compensate for a signal from the corresponding pull-up control signal lines MPU. Number of transistors included in each of the second pull-up compensation subcircuits 412 may be set according to actual needs. In the embodiment as shown in FIG. 8, two transistors are included, i.e., a sixth transistor T6 and a seventh transistor T7.

In this exemplary embodiment, the second pull-down compensation subcircuit 422 is connected to the pull-down control signal line MPD, and the second pull-down compensation subcircuit 422 may be configured to synchronously compensate for a signal from the pull-down control signal line MPD. The second pull-down compensation subcircuits 422 may be arranged in one-to-one correspondence with the pull-down control signal lines MPU, and the second pull-down compensation subcircuits 422 may be configured to synchronously compensate for a signal from the corresponding pull-down control signal line MPU. Number of transistors included in each of the second pull-down compensation subcircuits 422 may be set according to actual needs.

FIG. 8 only shows one of the second pull-up compensation subcircuits 412 and one of the second pull-down compensation subcircuits 422. In this exemplary embodiment, "synchronous compensation" may be understood as: pulling up a compensated signal on a rising edge of the compensated signal, and pulling down the compensated signal on a falling edge of the compensated signal, such that the rising edge and the falling edge of the compensated signal are steeper.

As shown in FIG. 8, the second pull-up compensation subcircuit 412 may include a sixth transistor T6 and a seventh transistor T7. A first electrode of the sixth transistor T6 may be connected to the pull-up control signal line MPU, and a second electrode of the sixth transistor T6 may be configured to receive a high-level power supply signal. A first electrode of the seventh transistor T7 may be connected to the pull-up control signal line MPU, and a second electrode of the seventh transistor T7 may be configured to receive a low-level power supply signal. The sixth transistor T6 may be turned on on the rising edge of the signal from the pull-up control signal line MPU, to pull up the signal from the pull-up control signal line MPU by means of the high-level power supply signal. The seventh transistor T7 may be turned on on the falling edge of the signal from the pull-up control signal line MPU, to pull down the signal from the pull-up control signal line MPU by means of the low-level power supply signal.

Similarly, the second pull-down compensation subcircuit 422 may include an eighth transistor T8 and a ninth transistor T9, where a first electrode of the eighth transistor T8 may be connected to the pull-down control signal line MPD, and a second electrode of the eighth transistor T8 may be configured to receive the high-level power supply signal. A first electrode of the ninth transistor T9 may be connected to the pull-down control signal line MPD, and a second electrode of the ninth transistor T9 may be configured to receive the low-level power supply signal. The eighth transistor T8 may be turned on on the rising edge of a signal from the pull-down control signal line MPD, to pull up the signal from the pull-down control signal line MPD by means of the high-level power supply signal. The ninth transistor T9 may be turned on the falling edge of the signal from the pull-down control signal line MPD, to pull down the signal from the pull-down control signal line MPD by means of the low-level power supply signal.

It is to be understood that this exemplary embodiment only shows that the second pull-up compensation subcircuit 412 and the second pull-down compensation subcircuit 422 both include two transistors, and one of the two transistors is configured to pull up a signal, and the other one is configured to pull down a signal. In other embodiments, the second pull-up compensation subcircuit 412 and the second pull-down compensation subcircuit 422 may both include one transistor, where the transistor in the second pull-up compensation subcircuit 412 is configured to pull up a signal, and the transistor in the second pull-down compensation subcircuit 422 is configured to pull down a signal. In parallel, the second pull-up compensation subcircuit 412 and the second pull-down compensation subcircuit 422 may both include a plurality of transistors (more than or equal to two), and the plurality of transistors in the second pull-up compensation subcircuit 412 are configured to pull up signals, and the plurality of transistors in the second pull-down compensation subcircuit 422 are configured to pull down signals.

As shown in FIG. 7, part of structures of the pull-up control signal line MPU may be positioned in the third integration region 633, and the pull-up control signal line MPU may be connected to the sixth transistor T6 and the seventh transistor T7 through a hole H, respectively. Part of structures of the pull-down control signal line MPD may be positioned in the fourth integration region 634, and the pull-down control signal line MPD may be connected to the eighth transistor T8 and the ninth transistor T9 through the hole H, respectively. This setting can improve the integration level of the output circuit and reduce the layout space of the output circuit.

It should be understood that in other exemplary embodiments, the pull-up control signal line MPU may also be positioned outside the third integration region 633, and the pull-down control signal line MPD may also be positioned outside the fourth integration region 634. For example, in a direction perpendicular to the first direction X, the third integration region 633 may be positioned between the pull-up circuit integration region 61 and the pull-down circuit integration region 62, and the fourth integration region 634 may also be positioned between the pull-up circuit integration region 61 and the pull-down circuit integration region 62. In addition, in other exemplary embodiments, the semiconductor device may be provided with the first integration region 631 and the second integration region 632, and may also be provided with the third integration region 633 and the fourth integration region 634.

Correspondingly, the output circuit may include the first pull-up compensation subcircuit 411 positioned in the first integration region 631 and the first pull-down compensation subcircuit 421 positioned in the second integration region 632, and may also include the second pull-up compensation subcircuit 412 positioned in the third integration region 633 and the second pull-down compensation subcircuit 422 positioned in the fourth integrated region 634. In addition, the second pull-up compensation subcircuit 412 positioned in the third integration region 633 and the second pull-down compensation subcircuit 422 positioned in the fourth integration region 634 may also directly perform pull-up compensation and pull-down compensation for the output signal line LDQ. That is, one electrode of the transistor in the second pull-up compensation subcircuits 412 or second pull-down compensation subcircuit 422 is directly connected to the output signal line LDQ, and other electrode of the transistor is connected to a high-level power supply or a low-level power supply to achieve pull-up or pull-down.

This exemplary embodiment also provides a memory, which may include the above-mentioned semiconductor device. For example, the memory may be a dynamic random access memory.

Other embodiments of the present disclosure will be apparent to those skilled in the art from consideration of the specification and practice of the contents disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure is only limited by the appended claims.

What is claimed is:

1. A semiconductor device, comprising a pull-up circuit integration region, a pull-down circuit integration region and a compensation circuit integration region not overlapped with one another, the semiconductor device further comprising an output circuit connected to a corresponding signal output line, and the output circuit comprising:
   a pull-up circuit connected to the signal output line, the pull-up circuit being positioned in the pull-up circuit integration region, the pull-up circuit comprising all pull-up subcircuits connected with the same signal output line;
   a pull-down circuit connected to the signal output line, the pull-down circuit being positioned in the pull-down circuit integration region, the pull-down circuit comprising all pull-down subcircuits connected with the same signal output line; and
   a compensation circuit configured to enhance a drive capability of an output signal from the signal output line, the compensation circuit being positioned in the compensation circuit integration region, the compensation circuit comprising all compensation subcircuits corresponding to the same signal output line.

2. The semiconductor device according to claim 1, wherein the signal output line extends along a first direction, and is configured to transmit a signal along the first direction; and
   at least a part of the compensation circuit integration region is positioned on a side of the pull-up circuit integration region in the first direction, and at least a part of the compensation circuit integration region is positioned on a side of the pull-down circuit integration region in the first direction.

3. The semiconductor device according to claim 2, wherein the compensation circuit comprises at least one first pull-up compensation subcircuit, the at least one first pull-up compensation subcircuit being configured to pull up the output signal;
   the compensation circuit integration region comprises a first integration region, the at least one first pull-up compensation subcircuit being positioned in the first integration region; and
   the first integrated region is positioned on a side of the pull-up circuit integration region in the first direction.

4. The semiconductor device according to claim 2, wherein the compensation circuit comprises at least one first pull-down compensation subcircuit, the at least one first pull-down compensation subcircuit being configured to pull down the output signal;
   the compensation circuit integration region comprises a second integration region, the at least one first pull-down compensation subcircuit being positioned in the second integration region; and
   the second integration region is positioned on a side of the pull-down circuit integration region in the first direction.

5. The semiconductor device according to claim 3, wherein the at least one first pull-up compensation subcircuit is connected to the signal output line and a first control signal line, the at least one first pull-up compensation subcircuit being configured to pull up the output signal in response to an enable signal from the first control signal line; and the pull-up circuit comprises a plurality of pull-up subcircuits, each of the plurality of pull-up subcircuits comprising a first transistor, a first electrode of the first transistor being connected to the signal output line, a second electrode of the first transistor being connected to a first high-level power supply terminal, and a gate of the first transistor being connected to a pull-up control signal line.

6. The semiconductor device according to claim 5, wherein the at least one first pull-up compensation subcircuit comprises a second transistor, a first electrode of the second transistor being connected to the signal output line, a second electrode of the second transistor being configured to receive a high-level power supply voltage, and a gate of the second transistor being connected to the first control signal line; and wherein a size of the first transistor is smaller than a size of the second transistor.

7. The semiconductor device according to claim 5, wherein number of the plurality of pull-up subcircuits in the pull-up circuit is greater than number of the first pull-up compensation subcircuits in the compensation circuit.

8. The semiconductor device according to claim 4, wherein the at least one first pull-down compensation subcircuit is connected to the signal output line and a second control signal line, the at least one first pull-down compensation subcircuit being configured to pull down the output signal in response to an enable signal from the second control signal line; and the pull-down circuit comprises a plurality of pull-down subcircuits, each of the plurality of pull-down subcircuits comprising a third transistor, a first electrode of the third transistor being connected to the signal output line, a second electrode of the third transistor being connected to a first low-level power supply terminal, and a gate of the third transistor being connected to a pull-down control signal line.

9. The semiconductor device according to claim 8, wherein the at least one first pull-down compensation subcircuit comprises a fourth transistor, a first electrode of the fourth transistor being connected to the signal output line, a second electrode of the fourth transistor being configured to receive a low-level power supply voltage, and a gate of the fourth transistor being connected to the second control signal line; and wherein a size of the third transistor is smaller than a size of the fourth transistor.

10. The semiconductor device according to claim 8, wherein number of the plurality of pull-down subcircuits in the pull-down circuit is greater than number of the first pull-down compensation subcircuits in the compensation circuit.

11. The semiconductor device according to claim 5, wherein the compensation circuit comprises at least one first pull-down compensation subcircuit, the at least one pull-down circuit comprising a plurality of pull-down subcircuits;

the at least one first pull-down compensation subcircuit is connected to the signal output line and a second control signal line, the at least one first pull-down compensation subcircuit being configured to pull down the output signal in response to an enable signal from the second control signal line;

the plurality of pull-down subcircuits are connected to the signal output line, a first low-level power supply terminal and a pull-down control signal line, the plurality of pull-down subcircuits being configured to transmit a signal from the first low-level power supply terminal to the signal output line in response to a signal from the pull-down control signal line;

the plurality of pull-up subcircuits are arranged along the first direction, the plurality of pull-down subcircuits being arranged along the first direction, and a region where the signal output line is positioned being positioned between the pull-up circuit integration region and the pull-down circuit integration region; and the first control signal line, the pull-up control signal line, the second control signal line and the pull-down control signal line extend along the first direction, a region where the first control signal line is positioned being positioned between a region where the pull-up control signal line is positioned and the region where the signal output line is positioned, and a region where the second control signal line is positioned being positioned between a region where the pull-down control signal line is positioned and the region where the signal output line is positioned.

12. The semiconductor device according to claim 1, wherein the signal output line extends along a first direction, and is configured to transmit a signal along the first direction; and at least a part of the compensation circuit integration region is positioned on a side of the pull-up circuit integration region in a second direction, and at least a part of the compensation circuit integration region is positioned on a side of the pull-down circuit integration region in the second direction, the second direction being opposite to the first direction.

13. The semiconductor device according to claim 12, wherein the compensation circuit comprises at least one second pull-up compensation subcircuit;

the compensation circuit integration region comprises a third integration region, the at least one second pull-up compensation subcircuit being positioned in the third integration region; and the third integration region is positioned on a side of the pull-up circuit integration region in the second direction.

14. The semiconductor device according to claim 12, wherein the compensation circuit comprises at least one second pull-down compensation subcircuit;

the compensation circuit integration region comprises a fourth integration region, the at least one second pull-down compensation subcircuit being positioned in the fourth integration region; and the fourth integration region is positioned on a side of the pull-down circuit integration region in the second direction.

15. The semiconductor device according to claim 13, wherein the pull-up circuit comprises a plurality of pull-up subcircuits, each of the plurality of pull-up subcircuits comprising a first transistor, a first electrode of the first transistor being connected to the signal output line, a second electrode of the first transistor being connected to a first high-level power supply terminal, and a gate of the first transistor being connected to a pull-up control signal line; and the at least one second pull-up compensation subcircuit is connected to the pull-up control signal line, the at least one second pull-up compensation subcircuit being configured to synchronously compensate for a signal from the pull-up control signal line.

16. The semiconductor device according to claim 14, wherein the pull-down circuit comprises a plurality of pull-down subcircuits, each of the plurality of pull-down subcircuits comprising a third transistor, a first electrode of the third transistor being connected to the signal output line, a second electrode of the third transistor being connected to a first low-level power supply terminal, and a gate of the third transistor being connected to a pull-down control signal line; and the at least one second pull-down compensation subcircuit is connected to the pull-down control signal line, the at least one second pull-down compensation subcircuit being configured to synchronously compensate for a signal from the pull-down control signal line.

17. The semiconductor device according to claim 13, wherein the at least one second pull-up compensation subcircuit is connected to the signal output line and a third control signal line, the at least one second pull-up compensation subcircuit being configured to pull up the output signal in response to an enable signal from the third control signal line.

18. The semiconductor device according to claim 14, wherein the at least one second pull-down compensation subcircuit is connected to the signal output line and a fourth control signal line, the at least one second pull-down compensation subcircuit being configured to pull down the output signal in response to an enable signal from the fourth control signal line.

19. A memory, comprising the semiconductor device according to claim 1.

\* \* \* \* \*